United States Patent
Jobson

(10) Patent No.: US 12,287,375 B2
(45) Date of Patent: Apr. 29, 2025

(54) DEVICE AND METHOD FOR DETERMINING AN ACTION BASED ON FORECASTED EoL PARAMETERS FOR AN ELECTRIC ESS AND AN AT LEAST PARTLY ELECTRIC VEHICLE

(71) Applicant: VOLVO TRUCK CORPORATION, Gothenburg (SE)

(72) Inventor: Edward Jobson, Gothenburg (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 620 days.

(21) Appl. No.: 17/647,427

(22) Filed: Jan. 7, 2022

(65) Prior Publication Data

US 2022/0334190 A1 Oct. 20, 2022

(30) Foreign Application Priority Data

Jan. 7, 2021 (EP) .................................. 21150587

(51) Int. Cl.
*G01R 31/392* (2019.01)
*B60L 55/00* (2019.01)
(Continued)

(52) U.S. Cl.
CPC ............ *G01R 31/392* (2019.01); *B60L 55/00* (2019.02); *B60L 58/13* (2019.02); *B60L 58/16* (2019.02);
(Continued)

(58) Field of Classification Search
CPC ................ G01R 31/392; G01R 31/387; G01R 31/3647; G01R 31/3648; B60L 55/00; B60L 58/16; B60L 58/13
(Continued)

(56) References Cited

U.S. PATENT DOCUMENTS

2002/0140404 A1* 10/2002 Lyden .................. G01R 31/367
320/166
2007/0285059 A1* 12/2007 Zettel .................... B60W 10/26
320/132
(Continued)

FOREIGN PATENT DOCUMENTS

EP      3748380 A1 * 12/2020   ......... G01R 31/3648
WO  WO-2013095249 A1 *  6/2013   ......... G01R 31/3634

OTHER PUBLICATIONS

European Search Report dated Jun. 16, 2021 in corresponding European Patent Application No. 21150587.0, 11 pages.

*Primary Examiner* — Suresh Memula
(74) *Attorney, Agent, or Firm* — Venable LLP; Jeffri A. Kaminski

(57) ABSTRACT

The invention relates to a method performed by a device for determining an action to be taken based on forecasted EoL parameters for an electric ESS and for an at least partly electric vehicle in which the electric ESS is comprised. The device obtains at least one ESS parameter impacted by utilization of the at least one electric vehicle and obtains at least one vehicle parameter impacted by utilization of the at least one electric vehicle. The device determines a forecasted EoL vehicle parameter based on the at least one vehicle parameter and a forecasted EoL ESS parameter based on the at least one ESS parameter. The device compares the forecasted EoL ESS parameter and the forecasted EoL vehicle parameter and determines the action to be taken based on a result of the comparing.

11 Claims, 5 Drawing Sheets

(51) Int. Cl.
  *B60L 58/13* (2019.01)
  *B60L 58/16* (2019.01)
  *G01R 31/36* (2020.01)
  *G01R 31/387* (2019.01)
(52) U.S. Cl.
  CPC ..... *G01R 31/3647* (2019.01); *G01R 31/3648* (2013.01); *G01R 31/387* (2019.01)
(58) Field of Classification Search
  USPC ........................................................ 320/134
  See application file for complete search history.

(56) References Cited

U.S. PATENT DOCUMENTS

| | | | | |
|---|---|---|---|---|
| 2007/0285061 | A1* | 12/2007 | Zettel | G01R 31/392 320/132 |
| 2010/0250038 | A1* | 9/2010 | Morita | B60L 58/12 320/136 |
| 2014/0019001 | A1 | 1/2014 | Nishizawa | |
| 2017/0005486 | A1* | 1/2017 | Marnfeldt | A61N 1/36128 |
| 2020/0353839 | A1* | 11/2020 | Tarchinski | B60L 53/62 |
| 2023/0231406 | A1* | 7/2023 | Yokoyama | B60L 58/16 320/137 |

* cited by examiner

100

DEVICE AND METHOD FOR DETERMINING AN ACTION BASED ON FORECASTED EoL PARAMETERS FOR AN ELECTRIC ESS AND AN AT LEAST PARTLY ELECTRIC VEHICLE

A device and method for determining an action based on forecasted EoL parameters for an electric ESS and an at least partly electric vehicle

TECHNICAL FIELD

The invention relates to a method and device for determining an action to be taken based on forecasted End of Life (EoL) parameters for an electric Energy Storage System (ESS) and for an at least partly electric vehicle in which the electric ESS is comprised. The invention relates to an at least partly electric vehicle comprising the device, a computer program and a computer readable medium.

The invention can be applied in at least partly electrical heavy-duty vehicles, such as trucks, buses and construction equipment etc. Although the invention will be described with respect to a fully electrified truck, the invention is not restricted to this particular vehicle, but may also be used in other vehicles such as buses, trailers, wheel loaders, excavators, passenger cars, marine vessels etc. It may also be applied in electrical systems of e.g. electrically operated vessels and in various working machines. It is applicable in fully electrically operated vehicles as well as in hybrid vehicles, comprising also a combustion engine. The invention may also be applied in electrical systems of e.g. electrically propelled and operated vessels and in various working machines.

BACKGROUND

The electric ESS comprised in an at least partly vehicle comprises one or more battery cells, and the one or more battery cells may be comprised in one or more batteries. Battery cell technology is currently evolving. As battery cell chemistries becomes better and better, a point where the battery cells are still fully functional by the time the vehicle lifetime is up will be reached. The term End of Life, abbreviated EoL is often use in this context and ways of extending the EoL, optimizing utilization during EoL are some of the issues that are currently being investigated. EoL may be associated with a certain time, e.g. years, mileage, consumed power, etc.

Currently, battery cells are under dimensioned and needs to be replaced after a certain time, e.g. after 5-8 years, However, battery cells are expected to be over dimensioned in the future to be able to fit-for-life for a majority of the at least partly electric vehicles. Battery cells in an at least partly electric vehicle also need to last for the whole life of the at least partly electric vehicle, i.e. it is desirable to avoid premature battery cell exchange.

For example, a battery cell may still have 70-80% of its original capacity left when the lifetime of the at least partly electric vehicle has ended. In the future, it is expected that surplus battery capacity will be available on-board many at least partly electric vehicles. When dimensioning the electric ESS it is often desirable to maximize the life of the electric ESS in order to avoid battery exchange before end-of-life of the at least partly electric vehicle. There are numerous procedures for maximizing the life, power and energy throughput of an electric ESS during the life until a target EoL is reached. The battery size (kWh), charge power etc. of the electric ESS is then optimized to give the most economically favourable life of the electric ESS.

Improvements and alternatives to the current procedures are currently being developed.

Therefore, there is a need to at least mitigate or solve these issues, or at least provide an alternative solution.

SUMMARY

An object of the invention is to provide a method which improves utilization of forecasted EoL parameters for an electric ESS and an at least partly electric vehicle.

The object is achieved by a method according to claim 1. According to a first aspect of the invention, the object is achieved by a method performed by a device for determining an action to be taken based on forecasted EoL parameters for an electric ESS and for an at least partly electric vehicle in which the electric ESS is comprised. The device obtains at least one ESS parameter impacted by utilization of the at least one electric vehicle and obtains at least one vehicle parameter impacted by utilization of the at least one electric vehicle. The device determines a forecasted EoL vehicle parameter based on the at least one vehicle parameter. The device determines a forecasted EoL ESS parameter based on the at least one ESS parameter. The device compares the forecasted EoL ESS parameter and the forecasted EoL vehicle parameter and determines the action to be taken based on a result of the comparing.

By the provision of the method for determining an action to be taken based on forecasted EoL parameters for an electric ESS and for an at least partly electric vehicle in which the electric ESS is comprised, the advantage being able to handle the case when there are differences between the forecasted EoL ESS parameter and the forecasted EoL vehicle parameter. The determine action may lead to optimization of electric ESS utilization. The action, which may be a second life application of the ESS, may be started before the EoL of the first application, i.e. to provide power to the at least partly electric vehicle, has been reached. There is no additional cost needed in order to perform the determined action, i.e. the second life application. The second life application is embedded in the at least partly electric vehicle.

Optionally, if the forecasted EoL vehicle parameter is of a first unit and the forecasted EoL ESS parameter is of a second unit which is different than the first unit, then the device may convert the forecasted EoL vehicle parameter to the second unit or convert the forecasted EoL ESS parameter to the first unit. When the forecasted EoL vehicle parameter and the forecasted EoL ESS parameter are of the same unit, then the comparison may be easy to perform and provides a reliable result.

Optionally, if the forecasted EoL vehicle parameter is of a first unit and the forecasted EoL ESS parameter is of a second unit which is different than the first unit, then the device may convert both the forecasted EoL vehicle parameter and the forecasted EoL ESS parameter to a third unit. An advantage of conversation to a third unit, i.e. a unit which is different from the first unit and the second unit, may be that the first unit and the second does not have to be convertible into each other. The only requirement for the first unit and the second unit may be that they are convertible into the third unit.

Optionally, if a result of comparing the forecasted EoL ESS parameter and the forecasted EoL vehicle parameter is that the forecasted EoL ESS parameter exceeds the forecasted EoL vehicle parameter, then the action comprises to determine that excess energy throughput in the ESS should be provided to a power grid such that the forecasted EoL ESS parameter at least substantially corresponds to the forecasted EoL vehicle parameter after the excess energy throughput has been provided to the power grid. An advantage of determining to providing excess energy throughput to the power grid is that the power grid, which may have lower amount of available power than what is needed, it may obtain extra power, e.g. measured in W, from the ESS when the electric grid has a power dip, e.g. observed as a lower voltage in the power grid. Another advantage may be that utilization of the ESS capacity is optimized since the excess energy throughput can be provided to the power grid instead of being not used at all.

Optionally, the excess energy throughput in the ESS may be provided to the power grid when the electric ESS comprised in the at least partly electric vehicle is connected to the power grid while being connected for charging. An advantage of providing the excess energy, e.g. Wh, throughput to the power grid when the electric ESS is connected to the power grid while being connected for charging may be that the at least partly electric vehicle can to a certain extent serve as a local energy storage without consuming/ageing the electric ESS during the vehicle life.

Optionally, if a result of comparing the forecasted EoL ESS parameter and the forecasted EoL vehicle parameter is that the forecasted EoL ESS parameter does not reach the forecasted EoL vehicle parameter, then the action may comprise to determine to adjust at least one of temperature, power outtake and charging of at least a part of the electric ESS such that the forecasted EoL ESS parameter at least substantially corresponds to the forecasted EoL vehicle parameter after the adjusting has been performed. An advantage of adjusting at least one of temperature, power outtake and charging may be that the need for replacing the electric ESS before the life of the vehicle ends is reduced or removed.

Optionally, the at least one ESS parameter may be associated with energy per hour, SOE, SoP, SoH, impedance and physical expansion of at least a part of the electric ESS. With at least one of these ESS parameters, and the basis on which the determination of the action to be taken is enlarged such that the result and its accuracy may be improved.

Optionally, the at least one ESS parameter may be obtained directly from the at least one electric vehicle or via an intermediate device. By obtaining the ESS parameter directly from the at least one electric vehicle, the number of connections and the length of these connections that the ESS parameter must pass before reaching the device is as low as possible, reducing the risk for loosing part of the ESS parameter on the way, reducing the risk for the ESS parameter not reaching the device etc. By obtaining the at least one ESS parameter via an intermediate device, an advantage may be that the need for storage memory in the device is reduced since the at least one ESS parameter is stored in the intermediate device.

Optionally, the least one vehicle parameter is associated with one or more of: mileage and hours of driving. An advantage with this is that it provide a representation of the impact of the at least partly electric vehicle, e.g. the aging of the electric ESS, during utilization of the at least one electric vehicle which enables determination of the forecasted EoL vehicle parameter to be made with high quality and that eventually enables a correct decision to be taken regarding the action.

Optionally, at least one of the forecasted EoL vehicle parameter and the forecasted EoL ESS parameter may be determined based on ESS parameters and vehicle parameters associated with utilization of at least one other electric vehicle. An advantage of this may be that the accuracy of the forecasted parameters may be improved, the correctness of the forecasted parameters may be improved, as the basis for the parameter determination has become larger.

According to a second aspect of the invention, the object is achieved by a device according to claim 10. The device is adapted to perform the method described above. Advantages and effects of the second aspect of the invention are similar to the advantages and effects with respect to the first aspect of the invention. It shall also be noted that all embodiments of the first aspect of the invention are applicable to and combinable with all embodiments of the second aspect of the invention and vice versa.

According to a third aspect of the invention, the object is achieved by an at least partly electric vehicle. Advantages and effects of the third aspect of the invention are similar to the advantages and effects with respect to the first aspect of the invention. It shall also be noted that all embodiments of the first aspect of the invention are applicable to and combinable with all embodiments of the third aspect of the invention and vice versa.

According to a fourth aspect of the invention, the object is achieved by a computer program. The computer program comprises instructions which, when executed on at least one processor, cause the at least one processor to carry out the method according to the first aspect.

According to a fifth aspect of the invention, the object is achieved by a computer readable medium. The carrier comprises the computer program for performing the method according to the first aspect, when said program product is run on a computer.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

The drawings are not necessarily to scale, and the dimensions of certain features may have been exaggerated for the sake of clarity. Emphasis is instead placed upon illustrating the principle of the embodiments herein.

DETAILED DESCRIPTION OF EXAMPLE EMBODIMENTS OF THE INVENTION

Figure 1:
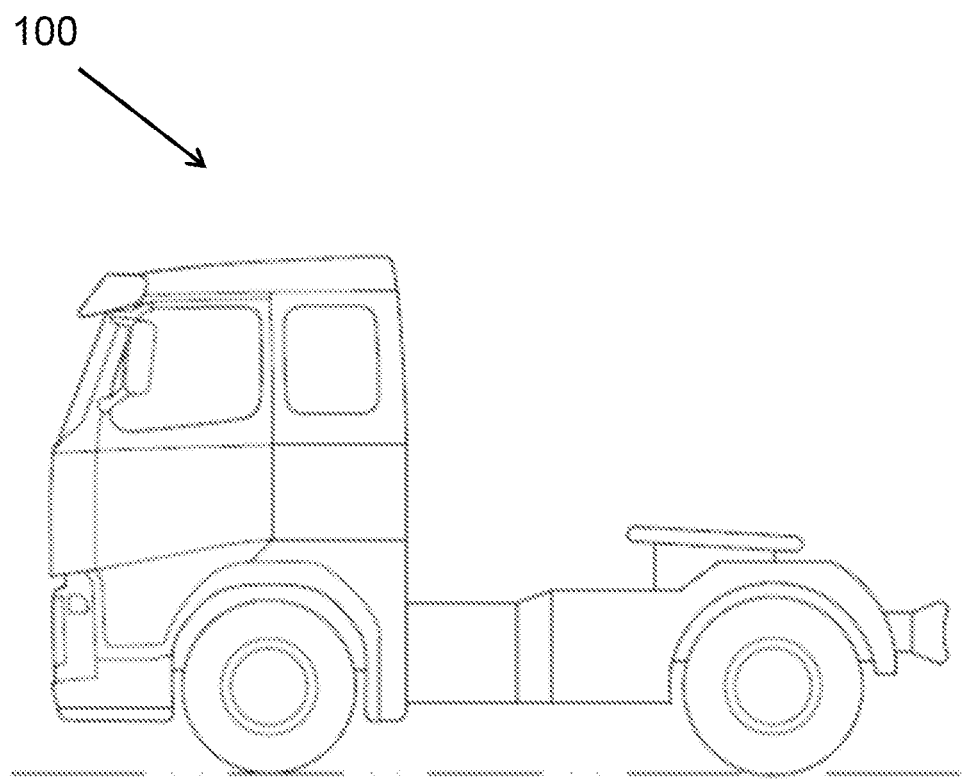
FIG. 1 is a schematic drawing illustrating an at least partly electrical vehicle.

FIG. 1 illustrates an at least partly electric vehicle 100. The at least partly electric vehicle 100 may be fully electrical driven or it may be partly electrical driven vehicle. The term vehicle may be used herein for the sake of simplicity when referring to the at least partly electric vehicle 100. The vehicle 100 may be referred to as being an at least partly electrically operated vehicle.

The vehicle 100 may be a heavy-duty vehicle, such as a truck, bus, construction equipment, trailer, wheel loader, excavator, passenger car, a marine vessel, an electrically operated vessel, a working machine, stationary backup power solution etc., or any other type of vehicle mentioned herein.

Figure 2:
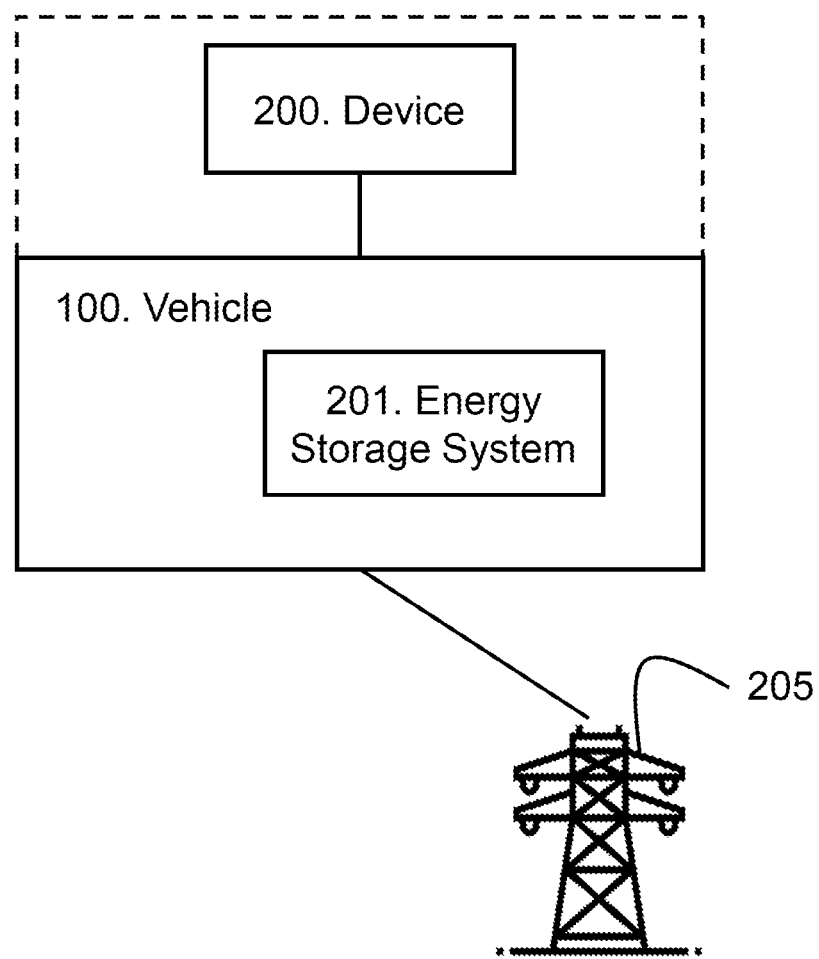
FIG. 2 is a schematic drawing illustrating a system.

FIG. 2 is a schematic block diagram illustrating a system. Note that what is illustrated in FIG. 2 is for the sake of simplicity, and that the system may comprise other units in addition to or instead of the ones illustrated in FIG. 2.

The system illustrated in FIG. 2 comprises the vehicle 100, and the vehicle 100 comprises an electric ESS 201. The electric ESS 201 may be referred to as an ESS, an electrical ESS, an electric storage system or an electrical storage system for the sake of simplicity. The ESS 201 may be adapted to power an electric motor or machine comprised in the vehicle 100.

The ESS 201 comprises at least one battery cell. The ESS 201 may comprise any n number of battery cells, where n is a positive integer. When the vehicle 100 comprises multiple battery cells, then these battery cells may be arranged with respect to each other in any suitable configuration, e.g. a serial configuration, a parallel configuration etc. The at least one battery cell may be comprised in a battery, also referred to as a battery pack, and the battery may be comprised in the ESS 201. There may be one, two or more batteries comprised in the ESS 201, and each battery may comprise at least one battery cell. The term battery may be used herein for the sake of simplicity when referring to any number of batteries comprised in the vehicle 100. The battery, also referred to as a traction battery, may be of any suitable type such for example lithium-ion battery, lithium polymer battery, fuel-cell battery, lead—acid battery, nickel metal hydride battery etc. The at least one battery cell comprised in the battery will consequently be of the same type as the battery. The battery may generate current in Direct Current (DC) form and needs DC current to be charged. The battery may be referred so as an electric battery.

The at least one battery cell may be a high voltage battery cell adapted to power and drive the vehicle 100, which is different from the vehicle's low voltage battery cell used to power the auxiliary loads of the vehicle 100.

The at least one battery cell is a rechargeable battery cell. Consequently, a battery comprising at least one battery cell may be referred to as a rechargeable battery. The at least one battery cell may be adapted to be charged by means of a charger (not shown), e.g. an onboard charger or an offboard charger, or by means of the electric machine with power from e.g. a combustion engine in case of a hybrid vehicle.

The system comprises a device 200. The device 200 may be comprised in the vehicle 100 (illustrated with the dotted box) or it may be a standalone device adapted to be connected to the vehicle 100 in any suitable way, e.g. wired, wirelessly, via an intermediate device etc.

The device 200 may be partly or completely comprised in the vehicle 100 (illustrated with a dotted box), or it may be external to and adapted to be connected to the vehicle 100. The device 200 may be a standalone and separate device adapted to perform the method described herein, or it may be combined or co-located with an already existing unit. The device 200 may be a battery management unit or it may be comprised in a battery management unit comprised in the ESS 201. The device 200 may be comprised in the ESS 201 of the vehicle 100, or it may be a separate device adapted to be connected to the ESS 201. The device 200 may be referred to as a control device, management unit or battery management unit.

The system illustrated in FIG. 2 shows a power grid 205. The power grid 205 may be referred to as an electric grid, a net grid etc. The power grid 205 is external to the vehicle 100. The power grid 205 may provide current in Alternating Current (AC) form. The power grid 205 may provide power to e.g. a charger which charges the ESS 201. It may be necessary to convert the current form the power grid 205 from AC to DC to be able to charge the ESS 201. The vehicle 100 may be adapted to be connected to the power grid 205 via any suitable means for connection, e.g. a wired connection.

As mentioned earlier, an electric ESS 201 are expected to be over dimensioned in the future to be able to fit-for-life for a majority of the vehicles 100. For such scenarios, the electric ESS 201 may be used for a second life purpose, as an energy storage, a grid stabilization power sharing, while it is still fitted in the vehicle 100, i.e. in the early days of the first life of the vehicle's life. A number of parameters such as an ESS parameter, a vehicle parameter, a forecasted EoL vehicle parameter, a forecasted EoL ESS parameter etc., may be necessary for this purpose, and they will be described in more detail below. But first, an example will be given.

For example, the vehicle 100 drives 400 km or 8 hours per day and uses 450 kWh energy from the ESS 201 each day. With such utilization of the vehicle 100 and the ESS 201, it may be forecasted that the EoL of the ESS 201 will be when its State of Health (SoH) is less than 74%, and it may be forecasted that the EoL of the vehicle may be 900 000 km. At the exemplified utilization, the ESS 201 gives an energy throughput of 1 200 000 kWh before reaching the forecasted EoL. This means that the forecasted EoL mileage for the ESS 201 is 1 200 000 kWh×400 km/450 kWh=1 070 000 km. The forecasted EoL mileage for the ESS 201 (1 070 000 km) is larger than the forecasted EoL mileage for the vehicle 100 (900 000 km) which may indicate that the excess power of the ESS 201 may be provided to the power grid 205.

Figure 3:
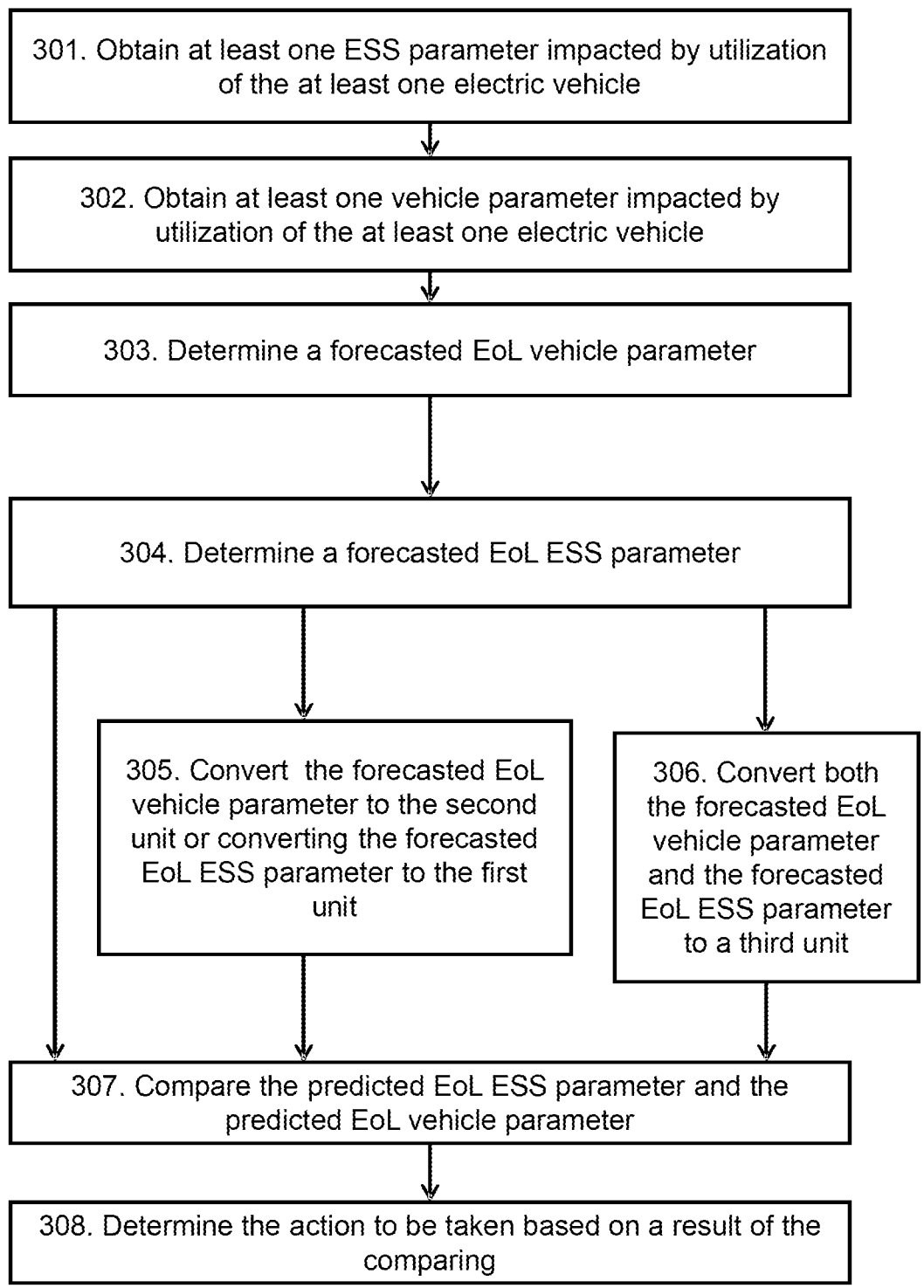
FIG. 3 is a flow chart illustrating a method.

The example given above will now be used when describing a method performed by the device 200. The different parameters mentioned above will also be described below. FIG. 3 is a flow chart illustrating a method performed by the device 200. The method comprises at least one of the following steps, and the steps may be performed in any suitable order than described below.

Step 301

The device 200 obtains at least one ESS parameter impacted by utilization of the at least one electric vehicle 100. The least one ESS parameter may be associated with one or more of: energy per hour, State of Energy (SoE), State of Power (SoP), SoH, impedance and physical expansion of at least a part of the ESS 201. The at least one ESS parameter may be at least one first ESS parameter.

The at least a part of the ESS 201 may be for example a battery cell comprised in the ESS 201. The at least one ESS parameter may be referred to as at least one ESS ageing parameter.

Using the example given above, the at least one ESS parameter may be e.g. 400 km driven distance representing that the vehicle consumes 450 kWh of the ESS 201 per day.

The at least one ESS parameter may be obtained directly from the at least one electric vehicle 100 or via an intermediate device, e.g. a cloud memory, a memory of the ESS manufacturer, a local device memory, an ESS local memory or from any other suitable device. The at least one ESS parameter may be obtained upon request, on a regular basis, it may be pushed to the device 200, it may be stored in the device 200 etc.

Utilization of the vehicle 100 may implicitly include utilization of the ESS 201 since it is necessary to use the ESS 201 in order to use the vehicle 100. When the vehicle 100 is used, it may be on, i.e. the ignition has been turned on, it may be standing still, or it may be moving.

Utilization of the at least one electric vehicle 100 may be use of the vehicle 100 impacting limiting parameters for the EoL of the ESS 201 and the vehicle 100, e.g. charging and driving the vehicle 100 in daily operation.

The at least one electric vehicle 100 may be utilized for a time period which is sufficient in order to obtain a repetitive and typical utilisation of the vehicle 100. For example, it may be a week if the at least one electric vehicle 100 is a bus, it may be one month if the at least one electric vehicle 100 is a truck. Seasons may be calculated.

The parameter SoH mentioned above is a parameter indicating the energy storage capacity which has been reached in the life cycle of the ESS 201 and a measure of its condition relative to a new and unused ESS 201. The unit of SoH is percentage. The SoH of the ESS 201 may decrease over time and use.

Utilization of the at least one electric vehicle 100 may be impacted by the environment in which it is utilized, which will be described in more detail later. Humidity, ambient temperature, altitude may be some examples of environmental parameters that may impact the utilization of the at least one electric vehicle 100.

Step 302

The device 200 obtains at least one vehicle parameter impacted by utilization of the at least one electric vehicle 100. The at least one vehicle parameter may be referred to as comprising at least one vehicle ageing parameter or it may be impacted by at least one vehicle ageing parameter. The at least one vehicle parameter may be at least one first vehicle parameter.

The least one vehicle parameter may be associated with one or more of: mileage, hours of driving, an electric motor, an inverter break, a power transmission, a gearbox and a reduction gear comprised in the at least one electric vehicle 100, accumulated power/energy outtake, accumulated brake power/energy, accumulated transported tonnage (tonne*km), accumulated speed*mileage, torque, power outtake, etc.

Using the example given earlier, the at least one vehicle parameter may be 400 km/day or 8h/day representing that the vehicle 100 drives 400 km per day or 8 hours per day.

Utilization of the at least one electric vehicle 100 may be as described above in step 301, and it may be impacted by the environment in which it is utilized.

The at least one vehicle parameter may be obtained directly from the at least one electric vehicle 100 or via an intermediate device, e.g. a cloud memory, a memory of the vehicle manufacturer, a local device memory, a vehicle local memory or from any other suitable device. The at least one vehicle parameter may be obtained upon request, on a regular basis, it may be pushed to the device 200, it may be stored in the device 200 etc.

From vehicle and ESS utilization data obtained in steps 301 and 302, e.g. charge/discharge rate, energy throughput, SOC-window, etc., it may be possible to determine if the ESS 201 will reach the its EoL before or after the EoL of the vehicle 100. In the same way, it may be possible to detect if the vehicle 100 is used in such a way that the ESS 201 will not reach the forecasted EoL ESS parameter by the end of the forecasted EoL vehicle parameter, e.g. the forecasted lifetime for the vehicle 100. This will now be described in the steps below.

Step 303

The device 200 determines a forecasted EoL vehicle parameter for the vehicle 100 based on the at least one vehicle parameter from step 302. The forecasted EoL vehicle parameter may be referred to as a predicted EoL vehicle parameter and is a forecasted or prediction of the EoL of the vehicle 100, i.e. how long the vehicle 100 will last. The forecasted EoL vehicle parameter may be a first forecasted EoL vehicle parameter.

With the example above, the forecasted EoL vehicle parameter may be 900 000 km representing that the vehicle will last for 900 000 km when it is driven 8 hours/day or 400 km/day.

The first forecasted EoL vehicle parameter may be determined based on at least one other vehicle parameter, e.g. a second vehicle parameter, associated with utilization of at least one other at least partly electric vehicle, i.e. at least one other vehicle which is different from the vehicle 100. The at least one other vehicle parameter associated may be comprised in a database, e.g. a back-office database, accessible by the device 200. A second forecasted EoL vehicle parameter may be determined for the other vehicle. At least one of the second vehicle parameter and the second forecasted EoL vehicle parameter may be used to calibrate, set or determine limit values for the first forecasted EoL vehicle parameter for the vehicle 100. The first forecasted EoL vehicle parameter may be within these limit values. Using other words, a database may comprise parameter data from other vehicles and where the resulting EoL ESS and EoL vehicle parameters may be used to calibrate the limit values for EoL ESS and EoL vehicle. To clarify, the vehicle 100 for which the first forecasted EoL vehicle parameter is determined in step 303 may be referred to as a first vehicle. The at least one other vehicle which may be different from the vehicle 100 may be referred to as at least one second vehicle. The first vehicle and the second vehicle may be of the same or different type, e.g. the first vehicle may be a bus and second vehicle may be a truck, both the first and the second vehicle may be a bus or any other suitable vehicle type.

Step 304

The device 200 determines a forecasted EoL ESS parameter for the ESS 201 based on the at least one ESS parameter from step 301.

The forecasted EoL ESS parameter may be referred to as a predicted EoL ESS parameter and is a forecasted or prediction of the EoL of the ESS 201, i.e. how long the ESS 201 will last. The forecasted EoL ESS parameter may be a first forecasted EoL ESS parameter.

With the example above, the forecasted EoL ESS parameter may be 1 200 000 kWh representing that 1 200 000 kWh of the ESS 201 will be used when the vehicle 100 is driven 8 h/day and using 450 kWh/day.

The first forecasted EoL ESS parameter may be determined based on at least one other ESS parameter, e.g. a second ESS parameter, associated with utilization of at least one other at least partly electric vehicle, i.e. at least one other vehicle which is different from the vehicle 100. The at least one other ESS parameter associated may be comprised in a database, e.g. a back-office database, accessible by the device 200. A second forecasted EoL ESS parameter may be determined for the other vehicle. At least one of the second ESS parameter and the second forecasted EoL ESS parameter may be used to calibrate, set or determine limit values for the first forecasted EoL ESS parameter for the vehicle 100. The first forecasted EoL ESS parameter may be within these limit values. Using other words, a database may comprise parameter data from other vehicles and where the resulting EoL ESS and EoL vehicle parameters may be used to calibrate the limit values for EoL ESS and EoL vehicle. To clarify, the vehicle 100 for which the first forecasted EoL ESS parameter is determined in step 303 may be referred to as a first vehicle. The at least one other vehicle which may be different from the vehicle 100 may be referred to as at least one second vehicle. The first vehicle and the second vehicle may be of the same or different type, e.g. the first vehicle may be a bus and second vehicle may be a truck, both the first and the second vehicle may be a bus or any other suitable vehicle type.

Step 305

If the forecasted EoL vehicle parameter is of a first unit and the forecasted EoL ESS parameter is of a second unit which is different than the first unit, then the device 200 may convert the forecasted EoL vehicle parameter to the second unit or convert the forecasted EoL ESS parameter to the first unit.

For example, the first unit may be km and the second unit may be kWh, which are different units. Then, km may be converted to kWh or kWh may be converted to km. Using the previous example, 1 200 000 kWh may be converted to km as follows: 1 200 000 kWh×400 km/450 kWh=1 070 000 km.

Step 306

If the forecasted EoL vehicle parameter is of a first unit and the forecasted EoL ESS parameter is of a second unit which is different than the first unit, then the device 200 may convert both the forecasted EoL vehicle parameter and the forecasted EoL ESS parameter to a third unit. The third unit may be different from both the first unit and the second unit.

For example, the first unit may be years and the second unit may be %, then the third unit may be km. In such example, the forecasted EoL ESS parameter may be SOH<74% which may be converted to 1 100 000 km. The forecasted EoL vehicle parameter may be 11 years which may be converted to 1 000 000 km.

Step 307

The device 200 compares the forecasted EoL ESS parameter and the forecasted EoL vehicle parameter. A result of the comparing may be that:
  a) the forecasted EoL ESS parameter is equal to or substantially equally to the forecasted EoL vehicle parameter,
  b) the forecasted EoL ESS parameter exceeds, i.e. is larger than or above, the forecasted EoL vehicle parameter,
    b1) the EoL ESS parameter exceeds the forecasted EoL vehicle parameter with a first amount, or
    b2) the EoL ESS parameter exceeds the forecasted EoL vehicle parameter with a second amount, the first amount is larger than the second amount
  c) the forecasted EoL ESS parameter does not reach, i.e. is smaller than or below, the forecasted EoL vehicle parameter.

Step 308

The device 200 determines the action to be taken based on a result of the comparing, i.e. the comparing in step 307. The action may be one or more of the ones described below in steps 308a, 308b and 308c.

Step 308a

If the result of the comparing is item a) listed in step 307, i.e. that the forecasted EoL ESS parameter is equal to or substantially equally to the forecasted EoL vehicle parameter, then the ESS 201 and the vehicle 100 will have substantially the same EoL and the action may be to continue utilization of the vehicle 100 and the ESS 201 as it is currently being utilized.

When the result of the comparing is that the parameters are equal or substantially equal, the ESS 201 may be cycled, e.g. charged and discharged, with e.g. 5-10% at SOC<50% without substantially affecting the aging of the ESS 201 or without affecting the aging at all.

Step 308b

If the result of the comparing is item b) listed in step 307, i.e. that the forecasted EoL ESS parameter exceeds, i.e. is larger than or above, the forecasted EoL vehicle parameter, then the action may be to determine that excess energy throughput in the ESS 201 may be provided to a power grid 205 such that the forecasted EoL ESS parameter at least substantially corresponds to the forecasted EoL vehicle parameter after the excess energy throughput has been provided to the power grid 205. Providing the power to the power grid 205 may be referred to as a vehicle to grid operation. The term at least substantially corresponding to refers to that the forecasted EoL ESS parameter and the forecasted EoL vehicle parameter are exactly the same or almost the same, e.g. there may be an acceptable tolerance range for this. After determining that excess energy throughput should be provided to the power grid 205, the device 200 may initiate or trigger the providing of the excess energy throughput, e.g. by sending an instruction to the ESS 201, by informing the power grid 205 about the providing etc. The excess energy throughput in the ESS 201 may be provided to the power grid 205 when the ESS 201 comprised in the at least partly electric vehicle 100 is connected to the power grid 205 while being connected for charging.

The decision to provide excess energy throughput should be provided to the power grid 205 is done once, e.g. early in the life of the vehicle 100, and not continuously during the utilization of the vehicle 100. The advantage of allowing vehicle to grid operation in the early life may serve multiple purposes for example: the pay-back of the vehicle investment can be faster or the vehicle 100 can contribute to the daily operation of other vehicles in a vehicle fleet and the fleet owner or local energy supplier may not need to invest in electric grid reinforcement. Therefore, the earlier a solid analysis of the operation and a forecast of the EoL of the vehicle 100 and the ESS 201 can be done the better. How fast this may be done depends on the utilization. For a vehicle 100 such as a truck that is used in the same operation every day, approximately 14 days of utilization may be enough to make a first forecast, based on statistics from other trucks it may be possible to compensate for seasonal variations in energy use. Furthermore, if a user of the vehicle 100 provides feed-back that the utilization is intended to continue, as logged, over the life of the truck the precision of the forecasted EoL determination may be made higher.

Another example may be a vehicle 100 such as a bus that typically is utilized in precise weekly cycles and logging the first week of utilization may theoretically be sufficient to forecast the utilization and hence the forecasted EoL vehicle parameter and the forecasted EoL ESS parameter.

A further example may be that some vehicles 100 such as e.g. trucks are used in different type of assignments, for some periods they are utilized intensively and for other periods the utilization is less intense. The more random, the more uncertain is the determination of the forecasted EoL ESS parameter and the forecasted EoL vehicle parameter. This may mean that some vehicles 100 may need several years of data accumulation, i.e. obtaining at least one ESS parameter and at least one vehicle parameter, to give a reliable forecast. The variation itself may be used to determine the reliability by statistical analysis.

If the device 200 may access a database, e.g. a back-office database, comprising data from a plurality of vehicles 100, the determination of the forecasted EoL vehicle parameter and the forecasted EoL ESS parameter may be improved.

Providing excess energy throughput to the power grid 205 may be referred to as Vehicle to Grid (V2G) energy. A V2G communication interface located between the vehicle 100 and the power grid 205 may be used for conveying the excess energy throughput to the power grid 205. The V2G communication interface may be a bi-directional communication interface.

The excess energy throughput may be provided to the power grid 205 at a certain time, e.g. during peak hours in order to stabilize the power grid 205. Information about the peak hours may be received by the device 200 from the power grid 205, it may be determined by the device 200 itself or in any other suitable way.

With step 308b, the ESS 201 may be used as a second life application before the forecasted EoL is reached, e.g. in order to reach the forecasted EoL.

If the forecasted EoL ESS parameter exceeds the forecasted EoL vehicle parameter with a first amount, item b1) above, the ESS 201 may be cycled, i.e. charged and discharged, in any suitable fashion, e.g. randomly or in any suitable order, which would affecting the aging of the ESS 201, but the aging does not matter since there is excess energy throughput. When the forecasted EoL ESS parameter exceeds the forecasted EoL vehicle parameter with a first amount, it may be described as the forecasted EoL ESS parameter much higher than the forecasted EoL vehicle parameter.

If the forecasted EoL ESS parameter exceeds the forecasted EoL vehicle parameter with a second amount, item b2) above, the ESS 201 may be cycled, i.e. charged and discharged, with low power within the whole allowable SOC area. The allowable area may be high discharge at high SOC and high charge rate at low SOC. When the forecasted EoL ESS parameter exceeds the forecasted EoL vehicle parameter with the second amount, it may be described as the forecasted EoL ESS parameter is higher than the forecasted EoL vehicle parameter, but lower than the first amount.

Items b1 and b2 illustrates that cycling of the ESS 201 may be done depending on the margin, i.e. depending on the amount that the forecasted EoL ESS parameter exceeds the forecasted EoL vehicle parameter.

Step 308c

If the result of the comparing is item c) listed in step 307, i.e. that the forecasted EoL ESS parameter does not reach, i.e. is smaller than or below, the forecasted EoL vehicle parameter, then the action may be that the device 200 determines to adjust at least one of temperature, power outtake and charging of at least a part of the ESS 201 such that the forecasted EoL ESS parameter at least substantially corresponds to the forecasted EoL vehicle parameter after the adjusting has been performed. The part of the ESS 201 may be a battery cell or any other unit comprised in the ESS 201. The term at least substantially corresponding to refers to that the forecasted EoL ESS parameter and the forecasted EoL vehicle parameter are exactly the same or almost the same, e.g. there may be an acceptable tolerance range for this.

Some terms used above when describing FIG. 3 and some other associated terms will now be described in more detail.

Vehicle Utilization

Utilization of the at least partly electric vehicle 100 may be associated with one or more parameter such as vehicle utilization parameter, utilization environment parameter, physical ageing parameters etc. Utilization of the at least one electric vehicle 100 may be real life usage of the vehicle 100. The utilization may lead to a characteristic ageing of the vehicle 100 and ESS 201 that may be used in determining the forecasted EoL vehicle parameter and the forecasted EoL ESS parameter. The vehicle utilization may be defined by a distance, altitude difference, speed, road roughness, operation of auxiliaries during driving and while not moving, hotel loads at resting and the operating hours.

The vehicle utilization may lead to deterioration of the vehicle 100, its drivetrain, transmission, axles etc.

The forecasted EoL parameter of the ESS 201 may be assumed to be impacted by the ESS parameters. The ESS ageing parameters are impacted by the utilization of the vehicle 100 as described below and by the optimization parameters used to control the ESS 201. Setting of the ESS control parameters may be allowed to be modified depending on the setting as described in the step 308c above.

Utilization Environment

In addition to the vehicle utilization, the environment in which the vehicle 100 operates will impact the ageing of the vehicle 100 and the ESS 201. Such utilization environment parameters may be ambient temperature, ambient air pressure, wind and humidity and salts/dust/dirt that the vehicle 100 is subjected to.

Physical Ageing Parameters

The ageing of the mechanical parts of the vehicle 100 and the ESS 201 may be impacted by the physical impact of utilizing, e.g. driving, the vehicle 100, i.e. physical aging parameters. Torque and vibrations caused by speed and road conditions and the accumulated mileage and accumulated operating hours that the vehicle 100 and the ESS 201 is subjected to may define the physical ageing parameters.

The physical ageing parameter may be associated with the vehicle 100 and the ESS 201. The physical ageing parameter may be physical vehicle ageing parameter, a physical ESS ageing parameter or both The physical ageing parameters may be or comprised in the at least one ESS parameter and the at least one vehicle parameter, or the physical ageing parameters may impact the at least one ESS parameter and the at least one vehicle parameter.

In the real life, EoL may be reached when the cost for repairing the vehicle 100 is higher than the remaining profit that it may generate. For the at least partly electric vehicle 100, the real EoL may be reached when the electric motor, the inverter or any other unit breaks down and an expected breakdown of power transmission, gearbox or reduction gear is soon to be expected. The forecasted EoL vehicle parameter may thus be determined for the specific vehicle 100. The forecasted EoL vehicle parameter for the at least partly electric vehicle 100 may for example be reached at:

1 200 000 km in haulage traffic or 1 000 000 km in haulage traffic including 30% rural roads or 800 000 km on rural roads mainly etc., or 30 000 hours operation in a distribution operation, or 5 000 000 000 ton*km in vocational operation The forecasted EoL vehicle parameter of the vehicle 100 may thus be a function mainly of the physical ageing parameters that the vehicle 100 has been subjected to during its life.

ESS Ageing Variables

The ESS 201 and its battery cell are aged by the electric duty cycle that it is subjected to by the vehicle utilization and the utilization environment. The ESS ageing variables may be for example: battery cell temperature, energy throughput, accumulated time in operation, accumulated time not in operation, charge power, discharge power, etc.

The ESS ageing variables may be associated with the ESS 201. The ESS ageing variables may be the at least one ESS parameter, the ESS ageing variables may impact the at least one ESS parameter or the ESS ageing variables may be comprised in the at least one ESS parameter.

ESS Ageing Parameters

The ESS ageing parameter may be the at least one ESS parameter described above, e.g. in relation to step 301, the ESS ageing parameter may impact the at least one ESS parameter or the ESS ageing parameter may be comprised in the at least one ESS parameter. The ESS 201 may be designed to enable favorable conditions for control of the ESS 201 and a control procedure may further outline the limiting factors for the ageing of the ESS 201. The battery cell may be one component comprised in the ESS 201 to monitor and control. The following parameters may be used to control the ESS use, i.e. ESS ageing:

SOC upper limit, e.g. a function of temperature,
SOC lower limit, e.g. a function of temperature,
SOP charging upper limit, a function of temperature,
A time that SOP upper limit is used,
SOP charging second upper limit after maximum allowed time at upper limit is reached,
SOP discharging, e.g. the same parameters but different values as SOP charging,
charge voltage
State of Energy (SoE),
or any other suitable parameter impacting the ESS aging The term SOP used above is short for State of Power and is a parameter indicating the ratio of peak power to nominal power.

Forecasted EoL Vehicle Parameter

The forecasted EoL vehicle parameter for an individual vehicle 100 may be determined by comparing physical ageing parameters that the vehicle 100 has been subjected to with test results and real-world experience of the expected life of other vehicles 100 also subjected to certain physical ageing parameters.

The forecasted EoL vehicle parameter may be a value or a value comprised in a table that look-up the characteristic forecasted EoL parameter for a certain vehicle utilization. The forecasted EoL vehicle parameter may be a real time function utilizing the real history of each vehicle 100 and the contribution minute-by-minute may be used to determine the forecasted EoL vehicle parameter.

Forecasted EoL ESS Parameter

The forecasted EoL ESS parameter of the ESS 201 may be associated with one or more of the following parameters:
1) SOH+
2) Impedance
3) Energy per hour
4) Physical expansion of a battery cell,
5) or any other suitable parameter that the forecasted EoL ESS parameter may be associated with.

Other special cases that may lead to the forecasted EoL ESS parameter may occur by applying a high discharge rate while the ESS 201 has a low temperature, e.g. a temperature below a threshold. This may indirectly be detected by observing a relatively stable impedance while the storage capacity, e.g. as measured by SOH, decreases.

EoL ESS Criteria

An EoL ESS criteria may be associated with the ESS 201, e.g. for each battery cell comprised in the ESS 201. Some examples of the EoL ESS criteria and limit values may be as follows:

SOH<SOH limit, e.g. 70% for battery cells made of Nickel Manganese Cobalt (NMC) or 55% for battery cells made of Lithium Iron Phosphate (LFP).

Impedance/resistance>impedance/resistance limit value, e.g. 150% of the original impedance/resistance.

In addition, an unusual relationship between the SOH and the impedance of the ESS 201 may trigger an EoL flag. I.e. SOH and impedance are normally continuous curves that, after an initial phase, develop in parallel. When the SOH decrease, the impedance decrease. A reason for the unusual relationship, e.g. the impedance does not increase and the SOH decreases, may for example be that Li plating has occurred when excessive power is applied at low temperatures.

Figure 4A:
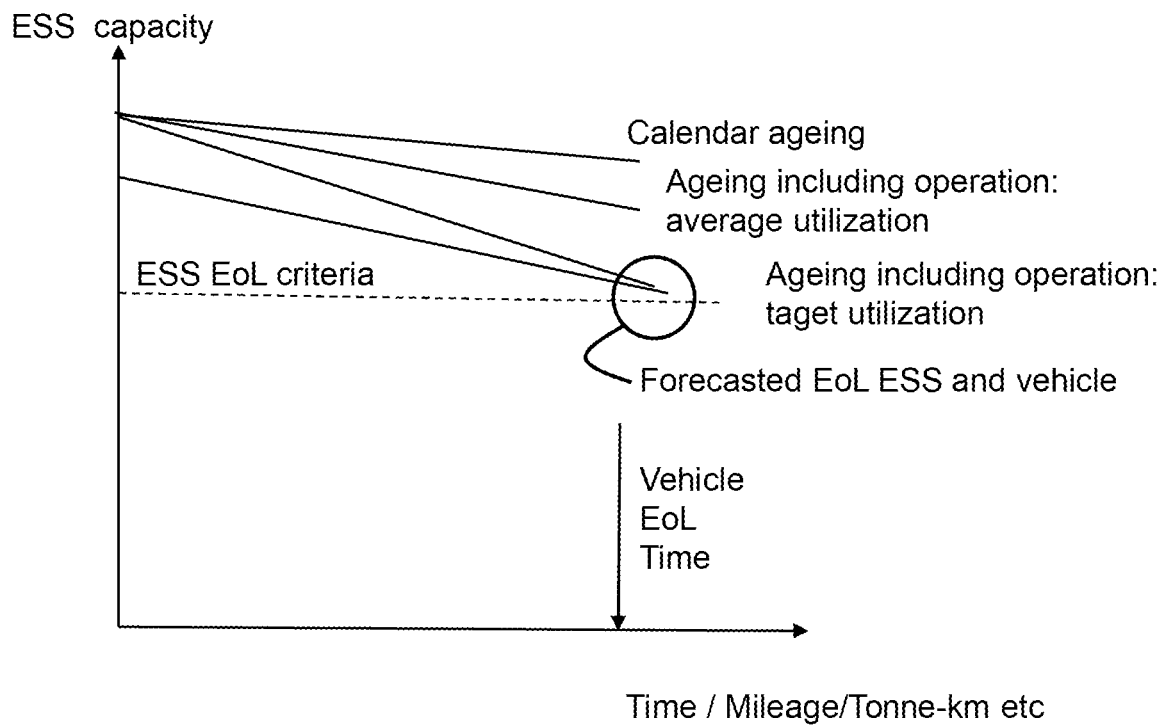
FIG. 4a is a graph illustrating forecasted EoL ESS parameter.
Figure 4B:
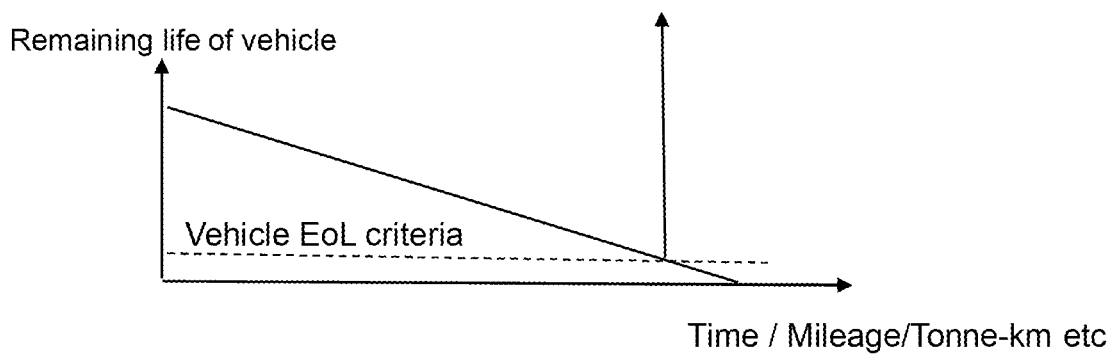
FIG. 4b is a graph illustrating forecasted EoL vehicle parameter.

Furthermore, the EoL ESS criteria may be set to encompass use of the ESS 201 comprising multiple battery cells. At the point in time when a certain SOH limit is passed, e.g. 70% is passed, small differences between battery cells may lead to an imbalance, even if continuous balancing is used. This may lead to accelerating events. This in turn may lead to that a reliable operation of the vehicle 100 cannot be forecasted effectively. Therefore, the SOH limit and the impedance limit may be real world data used for controlling reliable operation rather than theoretical limits for materials FIG. 4*a* and FIG. 4*b* illustrate examples of how forecasted trajectories might look like for different use cases. FIG. 4*a* illustrates an example ageing of the ESS 201 and FIG. 4*b* illustrates an example ageing of the vehicle 100. The x-axis of FIG. 4*a* represents time/mileage/tonne-km or any other suitable parameter etc. The y-axis of FIG. 4*a* represents ESS capacity, e.g. SOH. The upper curve shows the calendar ageing of the ESS 201 that occurs at a certain temperature and a certain charge status. I.e. the ageing when not in use. The curve below the upper curve shows an average including operation for an average utilization. The two bottom curves show aging of the ESS 201 including operation for a target utilization. The dotted horizontal line represents an ESS EoL criteria. For the average utilization, a certain loss of battery capacity, e.g. SOH, will occur due to the operation of the vehicle 100. For some target utilization cases, the operation may cause the forecasted EoL ESS parameter to occur simultaneously as the forecasted EOL vehicle parameter, as illustrated with the circle in the end of the two bottom curves. The average utilization of the ESS 201 thus has an excess life relative to the target utilization of the ESS 201. The present invention shows a method to utilize this difference during the life of the ESS in the vehicle 100.

The x-axis of FIG. 4*b* represents time, mileage, ton-km or any other suitable parameter. The y-axis represents a remaining life of the vehicle 100, e.g. its e-motor. The dotted horizontal line in FIG. 4*b* illustrates the vehicle EoL criteria.

Figure 5:
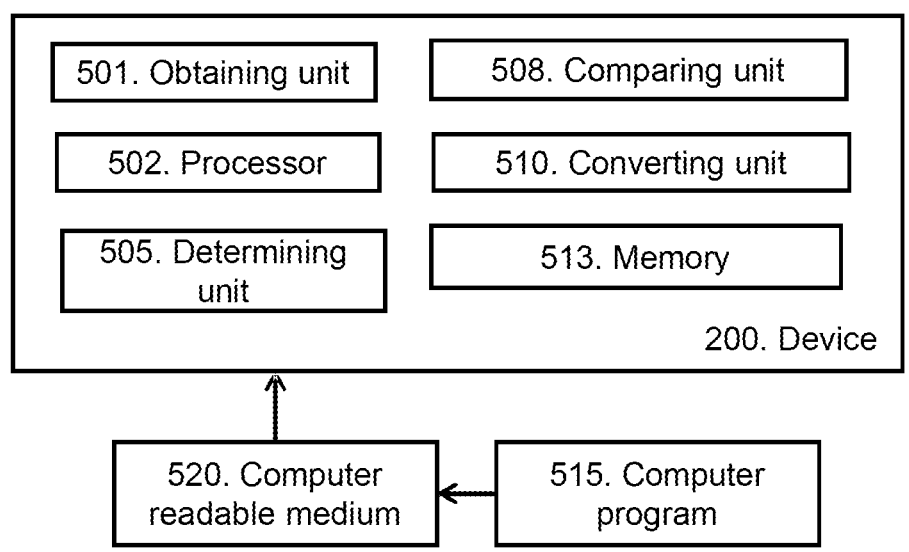
FIG. 5 is a schematic block diagram illustrating a device.

The device 200 is adapted to perform the method described herein. To perform the method steps shown in FIG. 3 for determining an action to be taken based on forecasted EoL parameters for an electric ESS 201 and for an at least partly electric vehicle 100 in which the ESS 201 is comprised, the device 200 may comprise an arrangement as shown in FIG. 5.

The device 200 is adapted to, e.g. by means of an obtaining unit 501, obtain at least one ESS parameter impacted by utilization of the at least one electric vehicle 100. The obtaining unit 501 may also be referred to as an obtaining module, an obtaining means, an obtaining circuit, means for obtaining etc. The obtaining unit 501 may be a processor 502 comprised in the device 200 or it may be the processor 502 of the device 200. The least one ESS parameter may be associated with energy per hour, SoE, SoP, SoH, impedance and physical expansion of at least a part of the electric ESS 201. The at least one ESS parameter may be obtained directly from the at least one electric vehicle 100 or via an intermediate device.

The device 200 is adapted to, e.g. by means of the obtaining unit 501 at least one vehicle parameter impacted by utilization of the at least one electric vehicle 100. The least one vehicle parameter may be associated with one or more of: mileage and hours of driving, accumulated power/energy outtake, accumulated brake power/energy, accumulated transported tonnage (tonne*km), accumulated speed*mileage etc.

The device 200 is adapted to, e.g. by means of a determining unit 505, determine a forecasted EoL vehicle parameter based on the at least one vehicle parameter. The determining unit 505 may also be referred to as a determining module, a determining means, a determining circuit, means for determining etc. The determining unit 505 may be the processor 502 comprised in the device 200 or it may be the processor 502 of the device 200.

The device 200 is adapted to, e.g. by means of the determining unit 505, determine a forecasted EoL ESS parameter based on the at least one ESS parameter.

The device 200 is adapted to, e.g. by means of a comparing unit 508, compare the forecasted EoL ESS parameter and the forecasted EoL vehicle parameter. The comparing unit 508 may also be referred to as a comparing module, a comparing means, a comparing circuit, means for comparing etc. The comparing unit 508 may be the processor 502 comprised in the device 200 or it may be the processor 502 of the device 200.

The device 200 is adapted to, e.g. by means of the determining unit 505, determine the action to be taken based on a result of the comparing.

The device 200 may be adapted to, e.g. by means of a converting unit 510, if the forecasted EoL vehicle parameter is of a first unit and the forecasted EoL ESS parameter is of a second unit which is different than the first unit, convert the forecasted EoL vehicle parameter to the second unit or to convert the forecasted EoL ESS parameter to the first unit. The converting unit 510 may also be referred to as a converting module, a converting means, a converting circuit, means for converting etc. The converting unit 510 may be the processor 502 comprised in the device 200 or it may be the processor 502 of the device 200.

The device 200 may be adapted to, e.g. by means of a converting unit 510, if the forecasted EoL vehicle parameter is of a first unit and the forecasted EoL ESS parameter is of a second unit which is different than the first unit, convert both the forecasted EoL vehicle parameter and the forecasted EoL ESS parameter to a third unit.

If a result of comparing the forecasted EoL ESS parameter and the forecasted EoL vehicle parameter is that the forecasted EoL ESS parameter exceeds the forecasted EoL vehicle parameter, then the device 200 may be adapted to, e.g. by means of the determining unit 505, take an action which may be to determine that excess energy throughput in the ESS 201 should be provided to a power grid 205 such that the forecasted EoL ESS parameter at least substantially corresponds to the forecasted EoL vehicle parameter after the excess energy throughput has been provided to the power grid 205.

The excess energy throughput in the electric ESS 201 may be provided to the power grid 205 when the electric ESS 201 comprised in the at least partly electric vehicle 100 is connected to the power grid 205 while being connected for charging.

If a result of comparing the forecasted EoL ESS parameter and the forecasted EoL vehicle parameter is that the forecasted EoL ESS parameter does not reach the forecasted EoL vehicle parameter, then the device 200 may be adapted to, e.g. by means of the determining unit 505, take an action which may be to determine to adjust at least one of temperature, power outtake and charging of at least a part of the electric ESS 201 such that the forecasted EoL ESS parameter at least substantially corresponds to the forecasted EoL vehicle parameter after the adjusting has been performed.

The device 200 may be adapted to, e.g. by means of the determining unit 505, determine at least one of the forecasted EoL vehicle parameter and the forecasted EoL ESS parameter based on other ESS parameters and other vehicle parameters associated with utilization of at least one other at least partly electric vehicle.

The device 200 may comprises the processor 502 and a memory 513. The memory 513 comprises instructions executable by the processor 502.

The at least partly electric vehicle 100 comprises the device 200 described herein A computer program 515 may comprise program code means for performing the steps of the method described herein when said program is run on a computer. A computer readable medium 520 may carry a computer program 515 comprising program code means for performing the steps of the method described herein when said program product is run on a computer.

The method described herein for determining an action to be taken based on forecasted EoL parameters for an electric ESS 201 and for an at least partly electric vehicle 100 in which the ESS 201 is comprised may be implemented through one or more processors, such as the processor 502 in the device 200 illustrated in FIG. 5, together with computer program code for performing the functions of the embodiments herein. The processor may be for example a Digital Signal Processor (DSP), Application Specific Integrated Circuit (ASIC) processor, Field-programmable gate array (FPGA) processor or microprocessor. The program code mentioned above may also be provided as a computer program product, for instance in the form of a data carrier carrying computer program code for performing the embodiments herein when being loaded into the device 200. One such carrier may be in the form of a CD ROM disc. It is however feasible with other data carriers such as a memory stick. The computer program code can furthermore be provided as pure program code on a server and downloaded to the device 200.

Summarized, the present invention relates to a control functionality for ESS ageing that allows excess energy throughput to be provided to the power grid 205. The present invention allows V2G operation in the early life of the vehicle 100. The present invention provides forecasted EoL optimization, including V2G optimization.

With the present invention, it is not necessary to determine the ageing of the ESS 201 due to vehicle to grid operation. Only the impact of the vehicle utilization is used to determine the energy/power available for vehicle to grid operation.

The ageing of the ESS 201 during vehicle utilization is assumed, which is a limiting factor for ESS ageing. The ageing of the ESS 201 during V2G operation is known. When adding the effect of the ESS calendar ageing. The ESS 201 will be consumed also when the vehicle 100 is not operated. This effectively adds to the benefit of using the ESS 201 in V2G operation in the early life of the vehicle 100. Calendar ageing may be described as the decrease of storage capacity that occurs also when the ESS 201 is not in use. The calendar ageing may typically be higher at high battery/ambient temperature and at high SOC. The calendar ageing may also be dependent on the chemical properties of the battery cell, e.g. LFP, NMC LCA etc. The ESS 201 may to some extent be cycled "within the calendar ageing" meaning that the cycling will not add further ageing to the calendar ageing when the cycling is done in the correct way, e.g. low SOC swing with low power at low SOC level. This storage of energy will then be for free.

The decision to provide excess energy throughput should be provided to the power grid 205 is done once, e.g. early in the life of the vehicle 100, and not continuously during the utilization of the vehicle 100.

With the present invention, any or at least some overcapacity of the ESS 201 may be utilized already in the early life of the vehicle 100, while adjusting the forecasted EoL ESS parameter so that it corresponds to the forecasted EoL vehicle parameter.

The term "at least one of A and B" should be understood to mean "only A, only B, or both A and B.", where A and B are any parameter, number, indication used herein etc.

The term "adapted to" used herein may also be referred to as "arranged to", "configured to", "capable of" or "operative to".

It is to be understood that the present invention is not limited to the embodiments described above and illustrated in the drawings; rather, the skilled person will recognize that many changes and modifications may be made within the scope of the appended claims.

The invention claimed is:

1. A method performed by a device for determining an action to be taken based on forecasted End of Life, EoL, parameters for an electric Energy Storage System, ESS, and for an at least partly electric vehicle in which the electric ESS is comprised, the method comprising:
   obtaining at least one ESS parameter impacted by utilization of the at least one electric vehicle;
   obtaining at least one vehicle parameter impacted by utilization of the at least one electric vehicle, wherein the least one vehicle parameter is associated with one or more of: mileage and hours of driving;
   determining a forecasted EL vehicle parameter based on the at least one vehicle parameter;
   determining a forecasted EoL ESS parameter based on the at least one ESS parameter;
   comparing the forecasted EoL ESS parameter and the forecasted EoL vehicle parameter; and
   determining the action to be taken based on a result of the comparing,
   if a result of comparing the forecasted EoL ESS parameter and the forecasted EoL vehicle parameter is that the forecasted EoL ESS parameter exceeds the forecasted EoL vehicle parameter, then the action comprises:
   determining that excess energy throughput in the electric ESS should be provided to a power grid such that the forecasted EoL ESS parameter at least substantially corresponds to the forecasted EoL vehicle parameter after the excess energy throughput has been provided to the power grid,
   wherein the excess energy throughput in the electric ESS should be provided to the power grid when the electric ESS comprised in the at least partly electric vehicle is connected to the power grid while being connected for charging.

2. The method according to claim 1, comprising:
   if the forecasted EoL vehicle parameter is of a first unit and the forecasted EoL ESS parameter is of a second unit which is different than the first unit, converting the forecasted EoL vehicle parameter to the second unit or converting the forecasted EoL ESS parameter to the first unit.

3. The method according to claim 1, comprising:
   if the forecasted EoL vehicle parameter is of a first unit and the forecasted EoL ESS parameter is of a second unit which is different than the first unit, converting both the forecasted EoL vehicle parameter and the forecasted EoL ESS parameter to a third unit.

4. The method according to claim 1, comprising:
   if a result of comparing the forecasted EoL ESS parameter and the forecasted EoL vehicle parameter is that the forecasted EoL ESS parameter does not reach the forecasted EoL vehicle parameter, then the action comprises:
   determining to adjust at least one of temperature, power outtake and charging of at least a part of the electric ESS such that the forecasted EL ESS parameter at least substantially corresponds to the forecasted EoL vehicle parameter after the adjusting has been performed.

5. The method according to claim 1, wherein the least one ESS parameter is associated with energy per hour, State of Energy, SOE, State of Power, SoP, State of Health, SoH, impedance and physical expansion of at least a part of the electric ESS.

6. The method according to claim 1, wherein the at least one ESS parameter is obtained directly from the at least one electric vehicle or via an intermediate device.

7. The method according to claim 1, wherein at least one of the forecasted EoL vehicle parameter and the forecasted EoL ESS parameter are determined based on other ESS parameters and other vehicle parameters associated with utilization of at least one other at least partly electric vehicle.

8. A device for determining an action to be taken based on forecasted End of Life, EoL, parameters for an electric Energy Storage System, ESS, and for an at least partly electric vehicle in which the electric ESS is comprised, the device being configured to perform the steps of:
   obtaining at least one ESS parameter impacted by utilization of the at least one electric vehicle;
   obtaining at least one vehicle parameter impacted by utilization of the at least one electric vehicle, wherein the least one vehicle parameter is associated with one or more of: mileage and hours of driving;
   determining a forecasted EoL vehicle parameter based on the at least one vehicle parameter;
   determining a forecasted EoL ESS parameter based on the at least one ESS parameter;
   comparing the forecasted EoL ESS parameter and the forecasted EoL vehicle parameter; and
   determining the action to be taken based on a result of the comparing,
   if a result of comparing the forecasted EoL ESS parameter and the forecasted EoL vehicle parameter is that the forecasted EoL ESS parameter exceeds the forecasted EoL vehicle parameter, then the action comprises:
   determining that excess energy throughput in the electric ESS should be provided to a power grid such that the forecasted EoL ESS parameter at least substantially corresponds to the forecasted EoL vehicle parameter after the excess energy throughput has been provided to the power grid, wherein the excess energy throughput in the electric ESS should be provided to the power grid when the electric ESS comprised in the at least partly electric vehicle is connected to the power grid while being connected for charging.

9. An at least partly electric vehicle comprising a device according to claim 8.

10. A non-transitory computer readable medium carrying a computer program comprising program code for performing, when said program code is run on a computer:
  obtaining at least one ESS parameter impacted by utilization of the at least one electric vehicle;
  obtaining at least one vehicle parameter impacted by utilization of the at least one electric vehicle, wherein the least one vehicle parameter is associated with one or more of: mileage and hours of driving;
  determining a forecasted EoL vehicle parameter based on the at least one vehicle parameter;
  determining a forecasted EoL ESS parameter based on the at least one ESS parameter;
  comparing the forecasted EoL ESS parameter and the forecasted EoL vehicle parameter; and
  determining the action to be taken based on a result of the comparing,
  if a result of comparing the forecasted EoL ESS parameter and the forecasted EoL vehicle parameter is that the forecasted EoL ESS parameter exceeds the forecasted EoL vehicle parameter, then the action comprises:
  determining that excess energy throughput in the electric ESS should be provided to a power grid such that the forecasted EoL ESS parameter at least substantially corresponds to the forecasted EoL vehicle parameter after the excess energy throughput has been provided to the power grid,
  wherein the excess energy throughput in the electric ESS should be provided to the power grid when the electric ESS comprised in the at least partly electric vehicle is connected to the power grid while being connected for charging.

11. The method according to claim 1, further comprising taking the action.

* * * * *